US007576489B2

(12) United States Patent
Hsu

(10) Patent No.: US 7,576,489 B2

(45) Date of Patent: Aug. 18, 2009

(54) PLASMA DISPLAY PANEL MODULE WITH PLURALITY OF FIXING DEVICES

(75) Inventor: Yao-Tung Hsu, Tao-Yuan Hsien (TW)

(73) Assignee: Chunghwa Picture Tubes, Ltd., Taipei (TW)

(*) Notice: Subject to any disclaimer, the term of this patent is extended or adjusted under 35 U.S.C. 154(b) by 315 days.

(21) Appl. No.: 11/425,154

(22) Filed: Jun. 20, 2006

(65) Prior Publication Data

US 2007/0290617 A1 Dec. 20, 2007

(51) Int. Cl.
*H01J 17/49* (2006.01)

(52) U.S. Cl. ...................... 313/582; 313/584; 313/586; 313/46

(58) Field of Classification Search ......... 313/582–587, 313/46; 445/23–25; 361/618, 714, 704
See application file for complete search history.

(56) References Cited

U.S. PATENT DOCUMENTS

| | | | | |
|---|---|---|---|---|
| 6,771,022 | B1 | 8/2004 | Lee | |
| 6,833,672 | B2 | 12/2004 | Aoki | |
| 2005/0017638 | A1* | 1/2005 | Kim | 313/582 |
| 2005/0099124 | A1 | 5/2005 | Chen | |
| 2005/0194900 | A1* | 9/2005 | Kim et al. | 313/582 |
| 2006/0005922 | A1* | 1/2006 | Watanabe | 156/291 |
| 2006/0061945 | A1* | 3/2006 | Kim | 361/681 |
| 2006/0152905 | A1* | 7/2006 | Kim et al. | 361/715 |
| 2006/0158851 | A1* | 7/2006 | Bae et al. | 361/700 |
| 2006/0214583 | A1* | 9/2006 | Jeong | 313/582 |

FOREIGN PATENT DOCUMENTS

| | | | | |
|---|---|---|---|---|
| JP | 07030834 | A | * | 1/1995 |
| JP | 9-312816 | | | 12/1997 |
| JP | 10013765 | | | 1/1998 |
| JP | 2005116346 | A | * | 4/2005 |
| TW | 1220053 | | | 8/2004 |
| TW | 1229829 | | | 3/2005 |
| TW | 1239548 | | | 9/2005 |

* cited by examiner

*Primary Examiner*—Joseph L Williams
*Assistant Examiner*—Kevin Quarterman
(74) *Attorney, Agent, or Firm*—Winston Hsu

(57) ABSTRACT

A plasma display panel module includes a plasma display panel having a rear plate and a front plate installed in parallel with the rear plate, an aluminum plate, and a plurality of fixing devices. The rear plate of the plasma display panel is installed between the front plate of the plasma display panel and the aluminum plate. The plurality of fixing devices has one end fixed to the aluminum plate, and the other end fixed to the front plate of the plasma display panel.

8 Claims, 6 Drawing Sheets

30 40 40 12 32 34 36 32 38 44 14 46 42 42 38 16 42 42

30 12 32 40 40 32 34 44 32 40 40 32 14

PLASMA DISPLAY PANEL MODULE WITH PLURALITY OF FIXING DEVICES

BACKGROUND OF THE INVENTION

1. Field of the Invention

The present invention relates to a plasma display panel module, and more particularly, to a plasma display panel module having a plurality of fixing devices for fixing the plasma display panel.

2. Description of the Prior Art

Please refer to FIG. 1, which is a side view of a plasma display panel module 10 according to the prior art. The plasma display panel module 10 comprises a plasma display panel 12, an aluminum plate 14, and an adhesive 16 for adhering the plasma display panel 12 to the aluminum plate 14, so that the plasma display panel 12 is fixed to the aluminum plate 14. The plasma display panel 12 comprises a front plate 17 and a rear plate 18.

In a prior art plasma display panel module, the plasma display panel 12 is stuck on the aluminum plate 14 only with the adhesive 16, whose stickiness gradually degrades in a rising temperature and humidity environment since the plasma display panel 12 generates heat in operation along with the factor of environmental humidity. This certainly causes the plasma display panel 12 incapable of being steadily fixed to the aluminum plate 14.

In order to solve the above problem, the plasma display panel module 10 can be fitted with some adhesive materials with better adhering characteristics in substitution for the adhesive 16. In such way, the problem that the plasma display panel 12 and the aluminum plate 14 separate due to high temperature and humidity is solved, but the cost also rise accordingly.

In addition to fixing the plasma display panel 12 to the aluminum plate 14, the adhesive 16 has to conduct heat generated by the plasma display panel 12 in operation to the aluminum plate 14 to cool off the plasma display panel 12. This further complicates the selection of the adhesive.

SUMMARY OF THE INVENTION

The plasma display panel module includes a plasma display panel having a rear plate and a front plate installed in parallel with the rear plate, an aluminum plate, and a plurality of fixing devices. The rear plate of the plasma display panel is installed between the front plate of the plasma display panel and the aluminum plate. The plurality of fixing device has one end fixed to the aluminum plate, and the other end fixed to the front plate of the plasma display panel.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
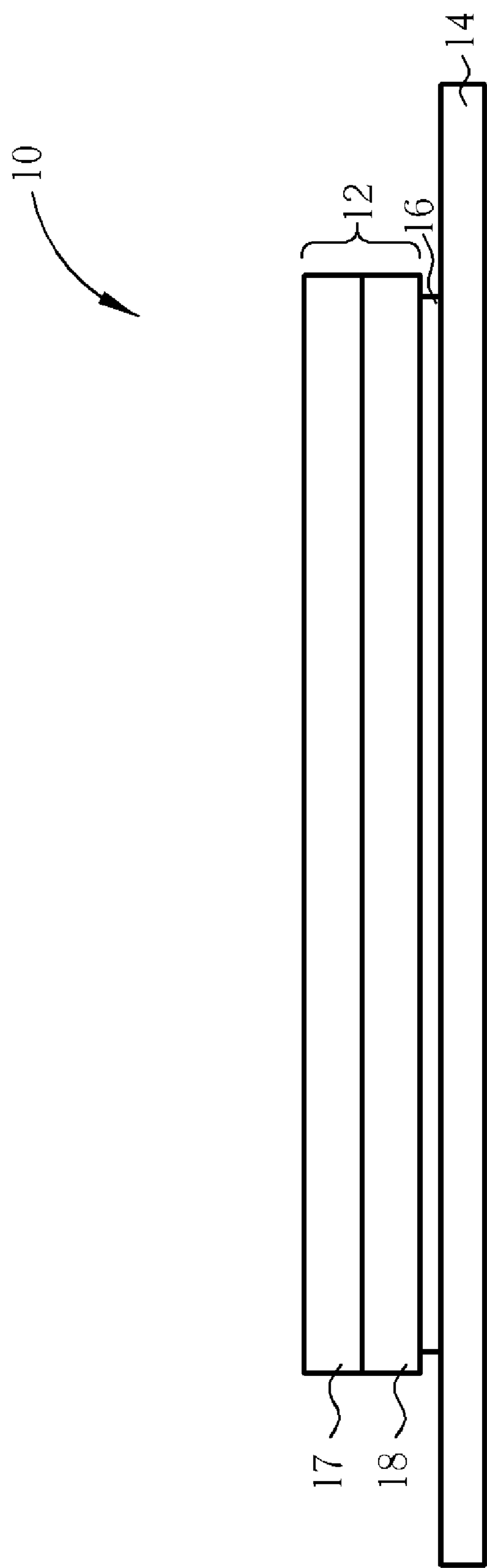
FIG. 1 is a side view of a plasma display panel module according to the prior art.
Figure 2:
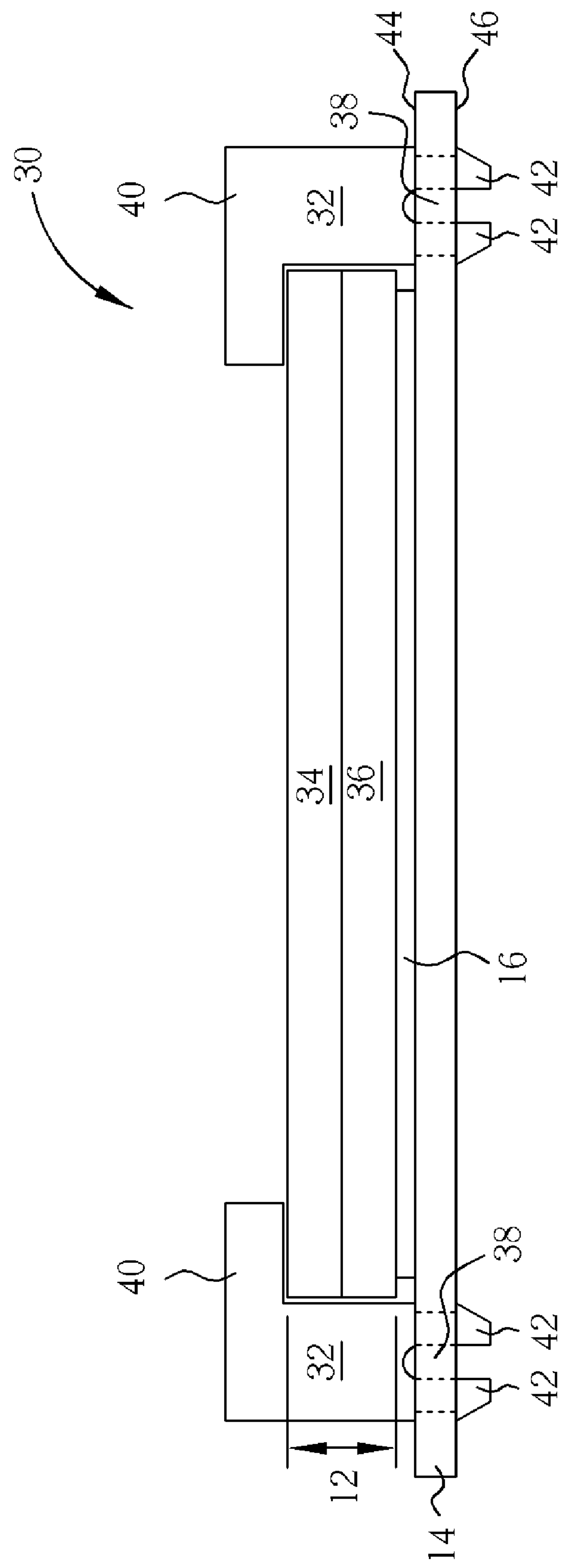
FIG. 2 is a side view of a plasma display panel module of a first embodiment according to the present invention.
Figure 3:
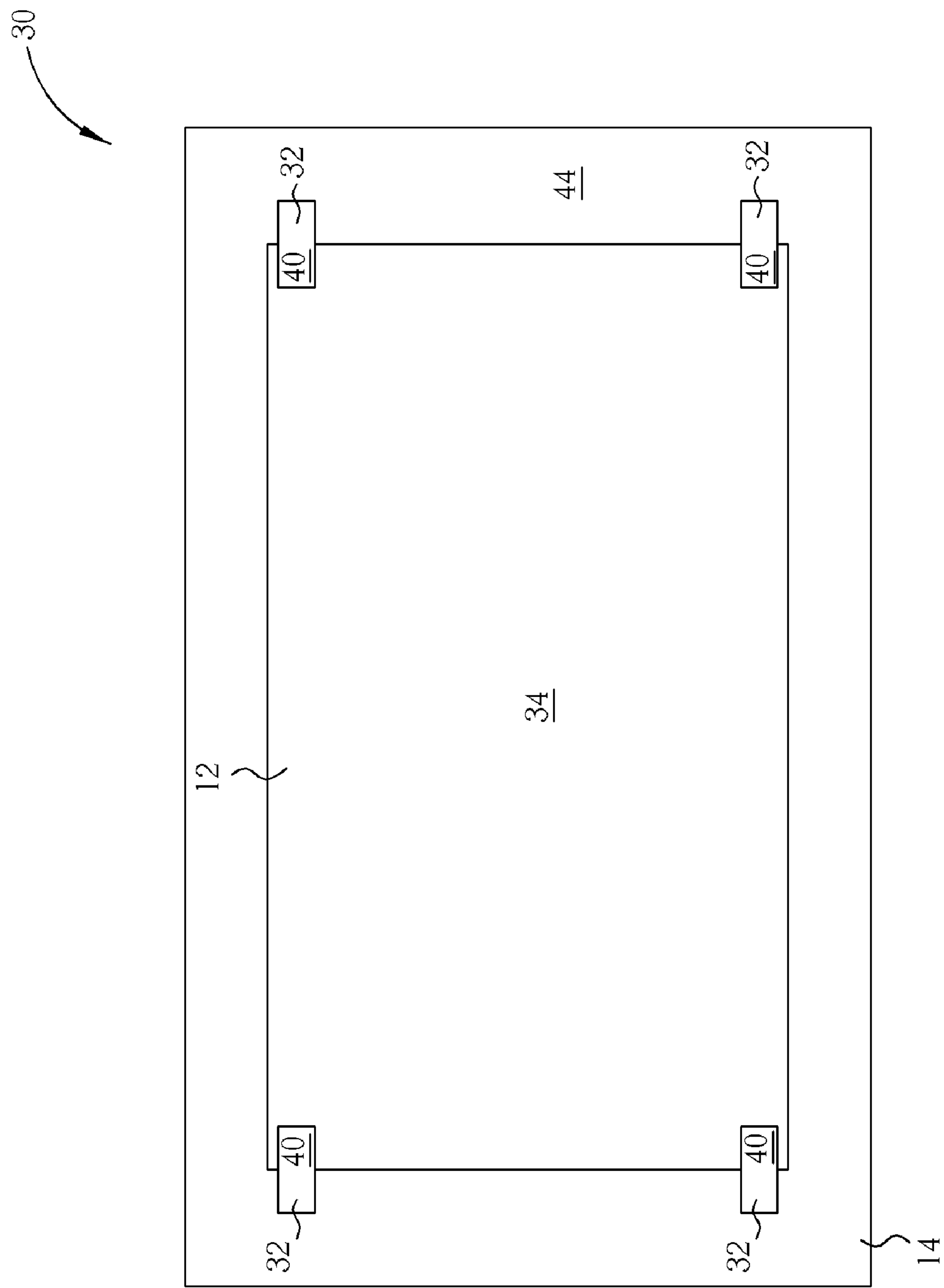
FIG. 3 is a top view of the plasma display panel module shown in FIG. 2.

Please refer to FIG. 2 and FIG. 3. FIG. 2 is a side view of a plasma display panel module 30 of a first embodiment according to the present invention. FIG. 3 is a top view of the plasma display panel module 30. The plasma display panel module 30 comprises a plasma display panel 12, an aluminum plate 14, an adhesive 16 and a plurality of fixing devices 32 (the fixing devices 32 are four in the exemplary embodiment, but it can be any number to implement the fixing devices 32 in the present invention as long as the fixing devices 32 function well) for fixing the plasma display panel 12 to the aluminum plate 14.

The plasma display panel 12 comprises a front plate 34,and a rear plate 36 installed in parallel with the front plate 34. Each of the fixing devices 32 has one end fixed to the aluminum plate 14, and the other end fixed to the front plate 34 of the plasma display panel 12.

Figure 4:
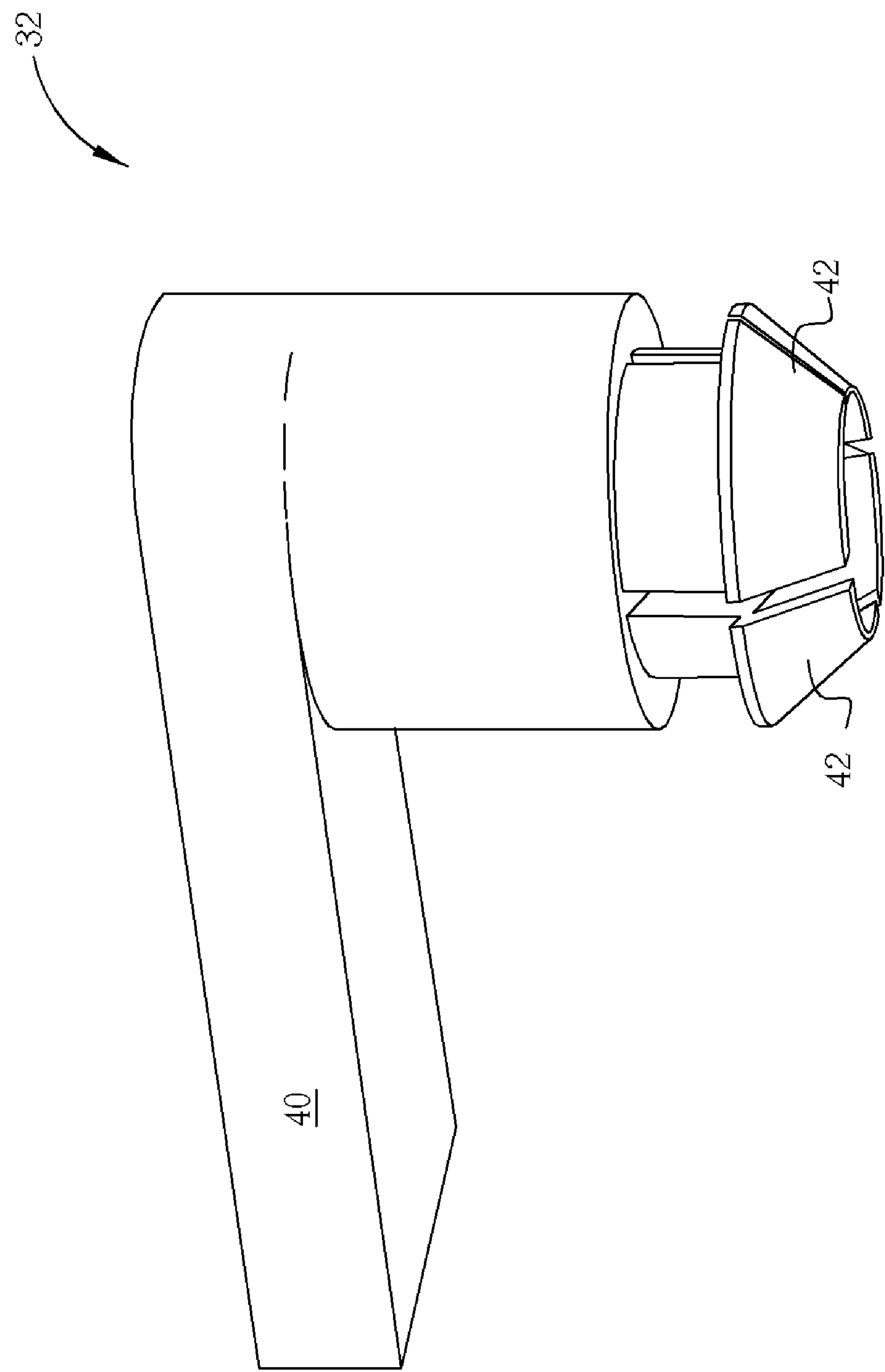
FIG. 4 is a perspective diagram of a fixing device of the plasma display panel module shown in FIG. 2.

According to the first embodiment, in which FIG. 2 shows the side view and FIG. 3 shows the top view of the plasma display panel module 30, the aluminum plate 12 comprises a plurality of holes 38 each corresponding to one of the four fixing devices 32. Each of the fixing devices 32 comprises a flange 40 and a plurality of inverted hooks, as shown in FIG. 4. When the fixing device 32 is fixed to the hole 38, the flange 40 presses the plasma display panel 12 against a front surface 44 of the aluminum plate 14, and the inverted hooks 42 stick through each corresponding hole 38 on the aluminum plate 14 and press against a rear surface 46 of the aluminum plate 14, wherein the front surface 44 of the aluminum plate 14 faces the rear plate 36 of the plasma display panel 12.

Therefore, even when the adhesive 16 becomes less effective due to the heat generated by the plasma display panel 12 and the humidity, the plasma display panel 12 is still fixed to the aluminum plate 14 steadily due to the installation of the fixing devices 32.

Figure 5:
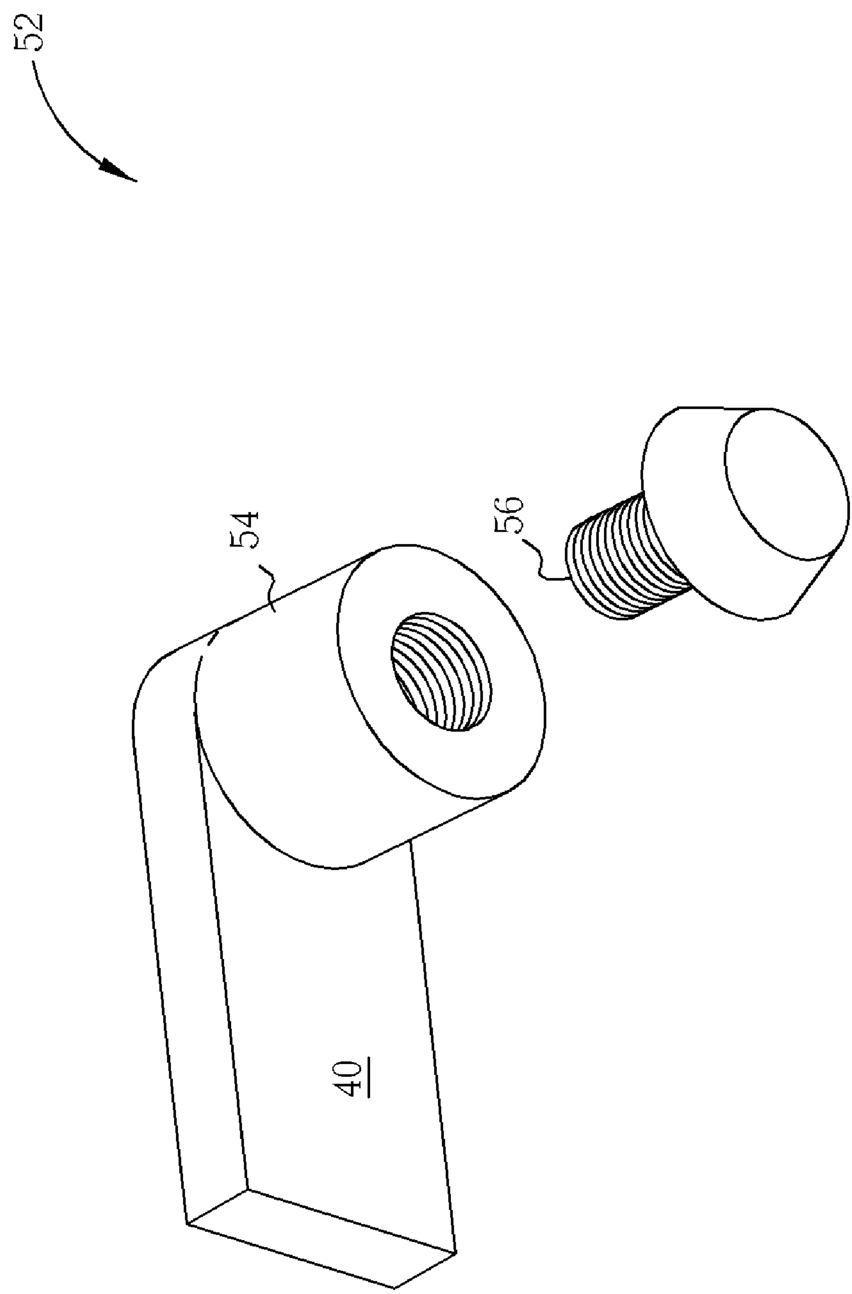
FIG. 5 is a perspective diagram of another fixing device of the plasma display panel of a second exemplary embodiment according to the present invention.

In the first embodiment of the present invention, the fixing device 32 is designed to comprise the flange 40 and the inverted hooks. However, a fixing device 52 of a plasma display panel module of a second exemplary embodiment of the present invention can be designed to comprise a threaded body 54 and a corresponding screw 56, as shown in FIG. 5. The flange 40 of the threaded body 54 holds the front plate 34 of the plasma display panel 12 when the threaded body 54 is secured at the hole 38 of the aluminum plate 14. The screw 56 is designed to contact the rear surface 46 of the aluminum plate 14 when threaded into the threaded body 54.

Figure 6:
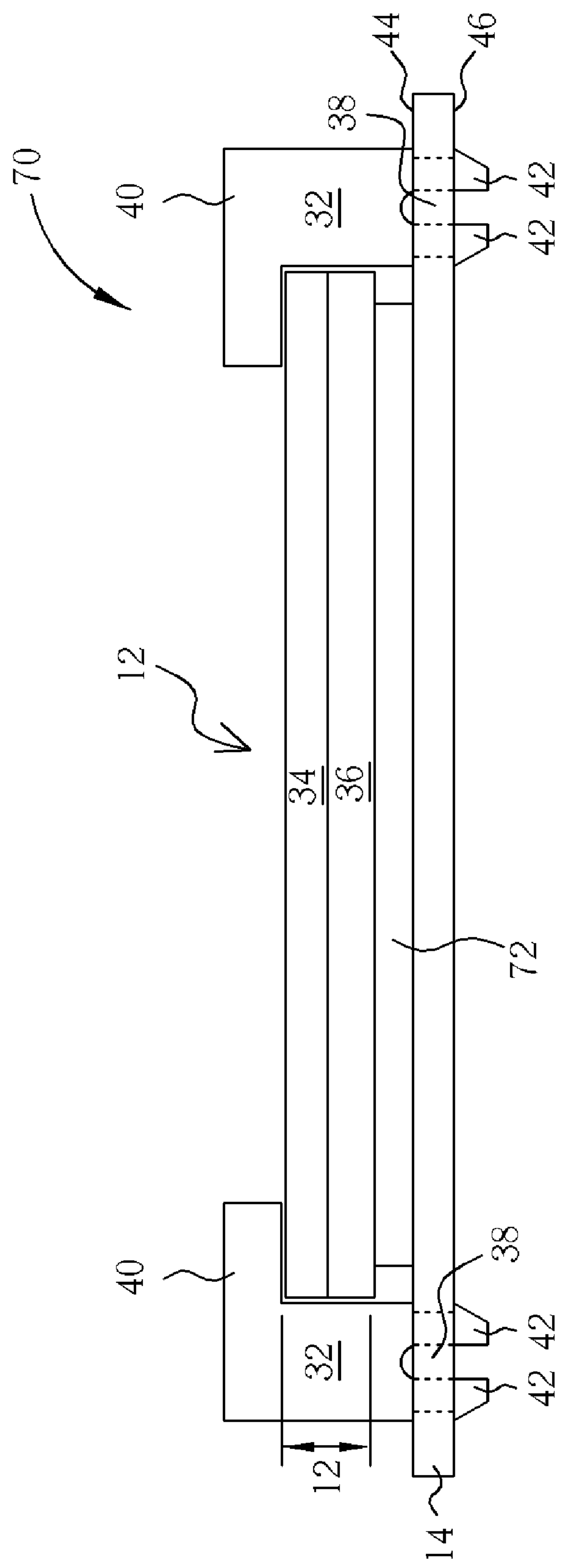
FIG. 6 is a side view of a plasma display panel module of a third embodiment according to the present invention.

Please refer to FIG. 6, which is a side view of a plasma display panel module 70 of a third embodiment according to the present invention. In addition to the plasma display panel 12, the aluminum plate 14, and the plurality of fixing devices 32 (or the fixing devices 52), the plasma display panel module 70 further comprises a graphite plate 72 installed between the rear plate 36 of the plasma display panel 12 and the front surface 44 of the aluminum plate 14 for conducting heat generated by the plasma display panel 12 to the aluminum plate 14. Since the fixing devices 52 (or the fixing devices 52) fixes the plasma display panel 12 and the aluminum plate 14 of the present invention, the adhesive 16 is not necessary in the plasma display panel module 30. In the third exemplary embodiment according to the present invention, no adhesive

16 is included as in the first exemplary embodiment, and the heat conduction is functioned by the graphite plate 72 instead.

In contrast to the prior art, the plasma display panel 12 can be fixed to the aluminum plate 14 steadily since the plasma display panel modules 30, 70 comprise the fixing devices 32, 52. Moreover, because the fixing devices 32 hold the aluminum plate 14 steadily, the selection of the adhesive 16 becomes less complicated. Besides, the fixing devices 32, 52 can in itself effectively fix the plasma display panel 12 on the aluminum plate 14, which substantially excludes the necessity of the adhesive 16. In addition, the fixing devices 32, 52 in the present invention enable the plasma display panel module 30 with easier assembly and disassembly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A plasma display panel module comprising:

a plasma display panel comprising:

a rear plate; and a front plate installed in parallel with the rear plate;

an aluminum plate, the rear plate of the plasma display panel being between the aluminum plate and the front plate of the plasma display panel; and a plurality of fixing devices having one end directly fixed to the aluminum plate and the other end directly fixed to the front plate of the plasma display panel.

2. The plasma display panel module of claim 1 further comprising an adhesive for adhering the rear plate of the plasma display panel to the aluminum plate.

3. The plasma display panel module of claim 2 wherein the adhesive is silicon adhesive.

4. The plasma display panel module of claim 1 further comprising a graphite plate installed between the rear plate of the plasma display panel and the aluminum plate for conducting heat generated by the plasma display panel in operation to the aluminum plate.

5. The plasma display panel module of claim 1, wherein the aluminum plate comprises a plurality of holes.

6. The plasma display panel module of claim 5, wherein the plurality of fixing devices comprises a flange and a plurality of inverted hooks, wherein the flange presses the plasma display panel against a front surface of the aluminum plate, and the inverted hooks press against a rear surface of the aluminum plate, the front surface of the aluminum plate facing the rear plate of the plasma display panel.

7. The plasma display panel module of claim 6 wherein the plurality of inverted hooks of the plurality of fixing devices is sticking through the corresponding plurality of holes of the aluminum plate to press against the rear surface of the aluminum plate.

8. The plasma display panel module of claim 5, wherein the plurality of fixing devices comprises:

a flange for holding the front plate of the plasma display panel;

a threaded body connected to the flange and aligned with the hole of the aluminum plate; and a screw threaded into the threaded body for fixing the aluminum plate to the threaded body.

* * * * *